(12) United States Patent
Bains et al.

(10) Patent No.: US 9,240,250 B2
(45) Date of Patent: Jan. 19, 2016

(54) APPARATUS AND METHOD TO REDUCE POWER DELIVERY NOISE FOR PARTIAL WRITES

(71) Applicants: Kuljit S. Bains, Olympia, WA (US); James A. McCall, Portland, OR (US); Pete D. Vogt, Boulder, CO (US); Michael Gutzmann, Forest Grove, OR (US)

(72) Inventors: Kuljit S. Bains, Olympia, WA (US); James A. McCall, Portland, OR (US); Pete D. Vogt, Boulder, CO (US); Michael Gutzmann, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 270 days.

(21) Appl. No.: 13/918,575

(22) Filed: Jun. 14, 2013

(65) Prior Publication Data

US 2014/0372815 A1 Dec. 18, 2014

(51) Int. Cl.
*G11C 29/24* (2006.01)
*G06F 13/16* (2006.01)
*G11C 5/14* (2006.01)
*G11C 29/02* (2006.01)
*G11C 29/04* (2006.01)

(52) U.S. Cl.
CPC ............ *G11C 29/24* (2013.01); *G06F 13/1668* (2013.01); *G11C 5/147* (2013.01); *G11C 29/023* (2013.01); *G11C 29/028* (2013.01); *G11C 2029/0401* (2013.01); *G11C 2029/0409* (2013.01)

(58) Field of Classification Search
CPC ...... G11C 29/24; G11C 5/147; G11C 29/023; G11C 2029/0401; G11C 2029/0409; G11C 29/028; G06F 13/1668
USPC ........................................ 714/721, 752, 785
See application file for complete search history.

(56) References Cited

U.S. PATENT DOCUMENTS

| | | | | |
|---|---|---|---|---|
| 5,025,256 | A | * | 6/1991 | Stevens ........................... 341/59 |
| 6,748,567 | B1 | * | 6/2004 | Ornes et al. ................... 714/785 |
| 2006/0155526 | A1 | * | 7/2006 | Castillo ..................... G06F 8/34 704/1 |

* cited by examiner

*Primary Examiner* — Guy Lamarre
(74) *Attorney, Agent, or Firm* — Alpine Technology Law Group LLC

(57) ABSTRACT

Apparatus, systems, and methods to reduce power delivery noise for partial writes are described. In one embodiment, an apparatus comprises a processor and a memory control logic to insert one or more dummy unit intervals into data in a write operation when a number of state transitions between adjacent unit intervals exceeds a threshold. Other embodiments are also disclosed and claimed.

25 Claims, 8 Drawing Sheets

APPARATUS AND METHOD TO REDUCE POWER DELIVERY NOISE FOR PARTIAL WRITES

FIELD

The present disclosure generally relates to the field of electronics. More particularly, some embodiments of the invention generally relate to methods to reduce power delivery noise for partial writes to memory.

BACKGROUND

Modern computer memory systems such as low-power double-data rate dynamic random-access memory (LPDDR) and wide input/output (WIO) memory operate within tight electrical tolerances. Write operations which transition large numbers of bits between logical states can generate electrical interference which may negatively affect operation of the memory. Accordingly, techniques to reduce power delivery noise for partial writes may find utility, e.g., in memory systems.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Some memory systems may be implemented using local, fast-access memory which is frequently embodied as a volatile memory and which may function as a cache memory and one or more remote memory devices which may comprise nonvolatile memory, e.g., magnetic or optical memory. By way of example, remote memory devices may comprise one or more direct in-line memory modules (DIMMs), each of which may comprise one or more memory ranks which in turn may comprise one or more Dynamic Random Access Memory (DRAM) chips or may include nonvolatile memory, e.g., 3-dimensional cross-point memory, flash memory, ferroelectric memory, silicon-oxide-nitride-oxide-silicon (SONOS) memory, polymer memory, memory, nanowire, ferroelectric transistor random access memory (FeTRAM or FeRAM), nanowire or electrically erasable programmable read-only memory (EEPROM). Some electronic devices (e.g., smart phones, tablet computers, and the like) may comprise simpler remote memory systems comprised of one or more DRAMs.

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Figure 1:
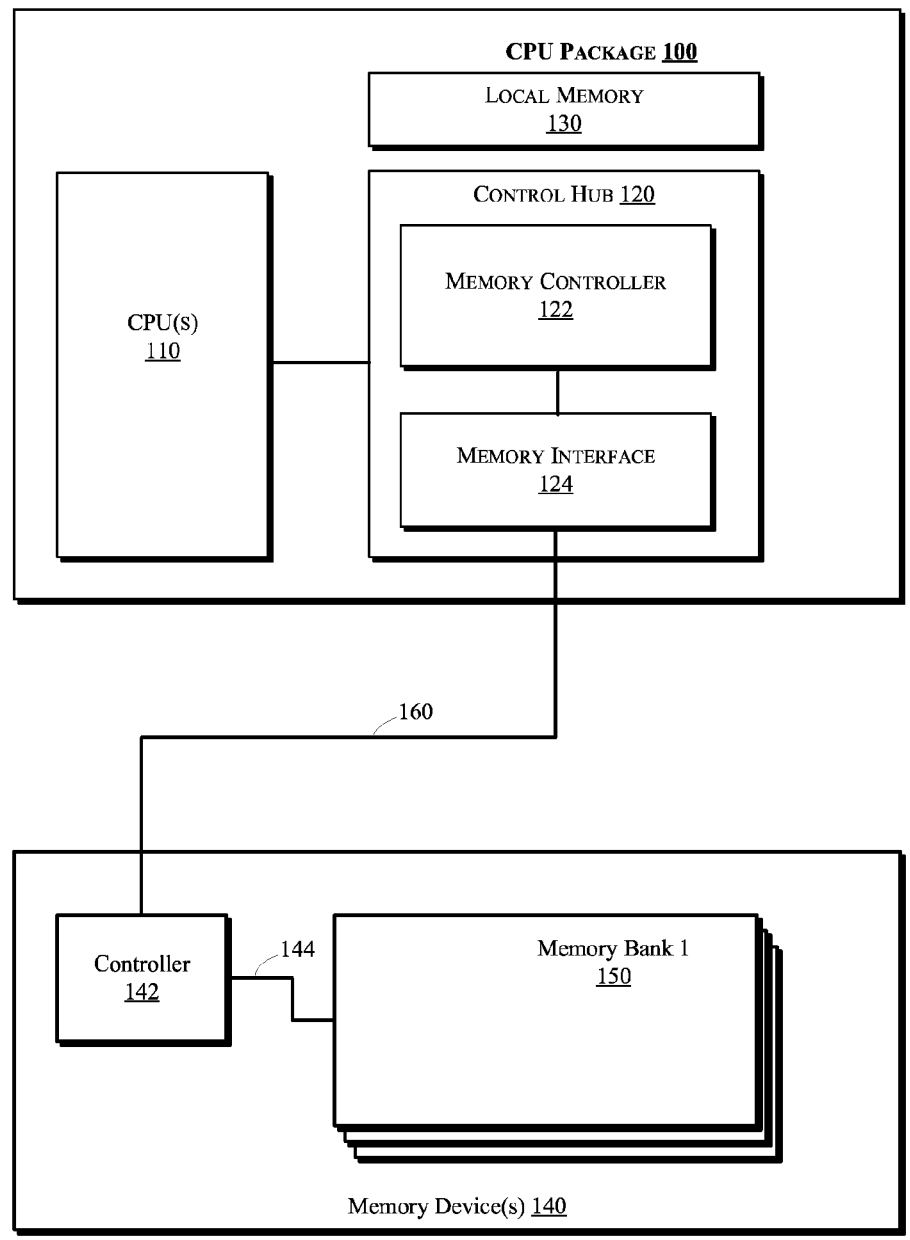
FIG. 1 is a schematic, block diagram illustration of components of apparatus to implement methods to reduce power delivery noise for partial writes in accordance with various embodiments discussed herein.

FIG. 1 is a schematic, block diagram illustration of components of apparatus to implement methods to reduce power delivery noise for partial writes in accordance with various embodiments discussed herein. Referring to FIG. 1, in some embodiments a central processing unit (CPU) package 100 which may comprise one or more CPUs 110 coupled to a control hub 120 and a local memory 130. Control hub 120 comprises a memory controller 122 and a memory interface 124.

Memory interface 124 is coupled to one or more remote memory devices 140 by a communication bus 160. Memory device 140 may comprise a controller 142 and one or more memory banks 150. In various embodiments, memory banks 150 may be implemented using dynamic random access memory (DRAM) memory, e.g., low-power double data rate (LPDDR) DRAM, Wide Input/Output (WIO) DRAM. By way of example, in some embodiments the memory device(s) 140 may comprise one or more direct in-line memory modules (DIMMs) coupled to a memory channel 144 which provides a communication link to controller 142. The specific configuration of the memory bank(s) 150 in the memory device(s) 140 is not critical As described above, in some embodiments logic in the memory controller 122 manages write operations to memory device(s) 140. More particularly, in some embodiments logic in the memory controller 122 implements operations which manage a number of state transitions between adjacent unit intervals in write operations directed to memory devices 140 to minimize, or at least to reduce, the number of state transitions between adjacent unit intervals. Reducing the number of state transitions between adjacent unit intervals results in lower levels of electrical interference, which may enhance the performance of the memory devices 140.

In some embodiments the state transitions to be managed may be a function of the type of termination applied to the memory device(s) 140. By way of example, if the memory device(s) 140 are terminated to ground, then the state transitions from logic low to logic high (i.e., from "0" to "1") may be actively managed. By contrast if the memory device(s) 140 are terminated to logic high, then the state transitions from logic high to logic low (i.e., from "1" to "0") may be actively managed. If the memory device(s) 140 are terminated to ground (i.e., center terminated or no termination), then all state transitions between logic low to logic high (i.e., from "0" to "1" and from "1" to "0") may be actively managed.

In some embodiments the memory controller 122 manages the number of state transitions between adjacent unit intervals by inserting one or more dummy unit intervals into data in a write operation when a number of state transitions between adjacent unit intervals exceeds a threshold. The memory controller 122 may spread write transactions over a larger period of time to provide room for dummy unit intervals. By way of example, a memory controller which routinely implements write operations in a burst length of 32 bits (BL32) may adopt a burst length of 16 bits (BL16) to generate room for dummy unit intervals. Odd bytes may be written in a first interval and even bytes may be written in a second interval.

Figure 2:
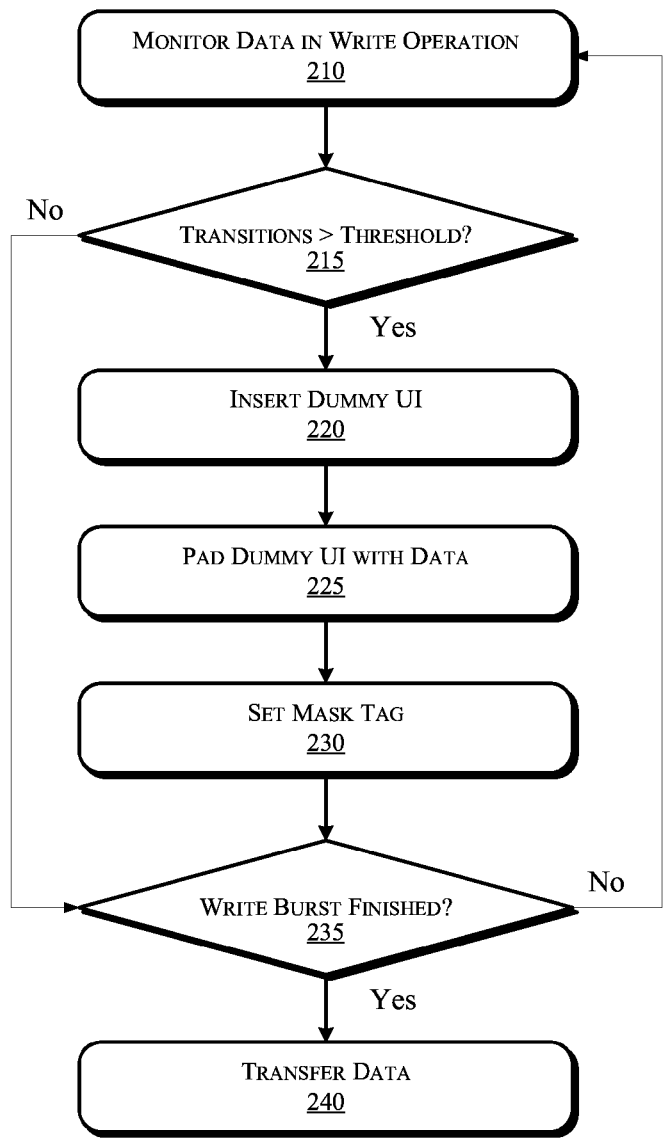
FIG. 2 is a flowchart illustrating operations in a method to reduce power delivery noise for partial writes in accordance with various embodiments discussed herein.

Operations implemented by memory controller 122 and the controller 142 will be described with reference to FIGS. 2 and 3-5. Referring to FIG. 2, at operation 210 the memory controller 122 monitors data in a write operation. By way of example, in operation memory controller 122 receives a request from a host, e.g., from an application executing on CPU 110 or another processor coupled to control hub 120, to write data to memory devices 140. Memory controller 122 may comprise one or more tables which translate logical address associated with the write operation received from the host to a physical address in the memory devices 140. Memory controller 122 may place the data on communication bus 160.

Figure 3:
FIGS. 3-5 are schematic illustrations of unit intervals in a methods to reduce power delivery noise for partial writes in accordance with various embodiments discussed herein.

In some embodiments methods to reduce power delivery noise for partial writes comprise monitoring the number of state transitions between adjacent unit intervals for data in a write operation. By way of example, logic in the memory controller 122 may keep a count of the number of state transitions between adjacent unit intervals in the write operation. Referring to FIG. 3, a portion of a write operation may include adjacent unit intervals indicated by UI1 and UI2. Logic in the controller 122 may compare the logical states of adjacent unit intervals and keep a count of the number of state transitions. In the example depicted in FIG. 3 there are 8 state transitions between UI1 and UI2.

Referring back to FIG. 2, if at operation 215 the number of state transitions between adjacent unit intervals does not exceed a threshold then control passes to operation 235. By contrast, if at operation 215 the number of transitions exceeds the threshold then control passes to operation 220 and the logic in the memory controller 122 inserts a dummy unit interval between the adjacent unit intervals. By way of example, referring to FIG. 3, logic in the memory controller 122 inserts a dummy unit interval indicated by UID between UI1 and UI2.

The threshold in operation 215 may be referred to as a threshold of change. One example of a threshold of change may be that no more than fifty percent (i.e., 4 out of 8) of the bits in adjacent unit intervals may change state. Other examples may range between a low threshold of change twelve and a half percent (i.e., 1 out of 8) or as high a threshold as eight-seven and a half percent (i.e., 7 out of 8). Enforcing a low threshold of change may require the insertion of multiple dummy unit intervals between UI1 and UI2.

Further, in some examples the threshold of change may be static, while in other examples the threshold of change may be dynamic and may vary based upon, e.g., an operating state of an electronic device which comprises or is coupled to the memory controller 142. By way of example, if the electronic device is operating in state characterized by a high data transfer rate the threshold of change may be increased to better utilize the bandwidth available on the communication bus 160. By contrast, if the electronic device is operating in state characterized by a low data transfer rate the threshold of change may be decreased to provide better electrical performance for the memory devices 140. Other factors may be used to adjust the threshold of change between adjacent unit intervals.

At operation 225 the controller 142 pads the dummy unit interval with data which reduces the number of state transitions between adjacent unit intervals. In the example depicted in FIG. 3 the logic in the memory controller 122 pads the dummy unit interval UID with all logic 1. This results in four state transitions between UI1 and UID and four state transitions between UID and UI2. In some embodiments the logic in the memory controller 122 pads the data in the dummy unit interval UID such that the number of state transitions between adjacent unit intervals is below the threshold of change identified in operation 215.

At operation 230 the memory controller 122 sets a data mask tag that is associated with the dummy unit interval. By way of example, in some embodiments the data mask tag may be a data mask bit which is transmitted on the communication bus with the dummy unit interval. The data mask tag may serve as a signal to the controller 142 that the data in the dummy unit interval is not to be written to the memory devices 140. When the controller 142 receives data that is masked, the controller 142 may disregard the data.

If, at operation 235, the write burst is not finished then control passes back to operation 210 and the logic in the memory controller 122 continues to monitor the data in the write operation. Thus, operations 210-235 define a loop pursuant to which the memory controller 122 monitors data in write operations and inserts dummy unit intervals between adjacent unit intervals which have a number of state transitions that exceeds a threshold. By contrast, if at operation 235 the write burst is finished then control passes to operation 24 and the data in the write burst is transferred to the memory device(s) 140. Operations 210-240 may be repeated for each write burst in a write operation.

Figure 4:
Figure 5:
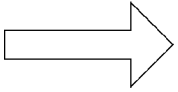

FIGS. 4 and 5 are additional examples of dummy unit intervals inserted between adjacent unit intervals to reduce a number of state changes. In the example depicted in FIG. 4 there are seven state transitions between UI1 and UI2. In response, the logic in memory controller 122 inserts a dummy unit interval UID between UI1 and UI2 and pads UID with data such that there are only three state transitions between UI1 and UID and four state transitions between UID and UI2.

In the example depicted in FIG. 5 there are six state transitions between UI1 and UI2. In response, the logic in memory controller 122 inserts a dummy unit interval UID between UI1 and UI2 and pads UID with data such that there are only three state transitions between UI1 and UID and two state transitions between UID and UI2.

The examples in FIGS. 3-5 assume that the memory device(s) 140 are not terminated (i.e., AC operation). Analogous methods apply to memory device(s) 140 that are terminated.

Figure 6:
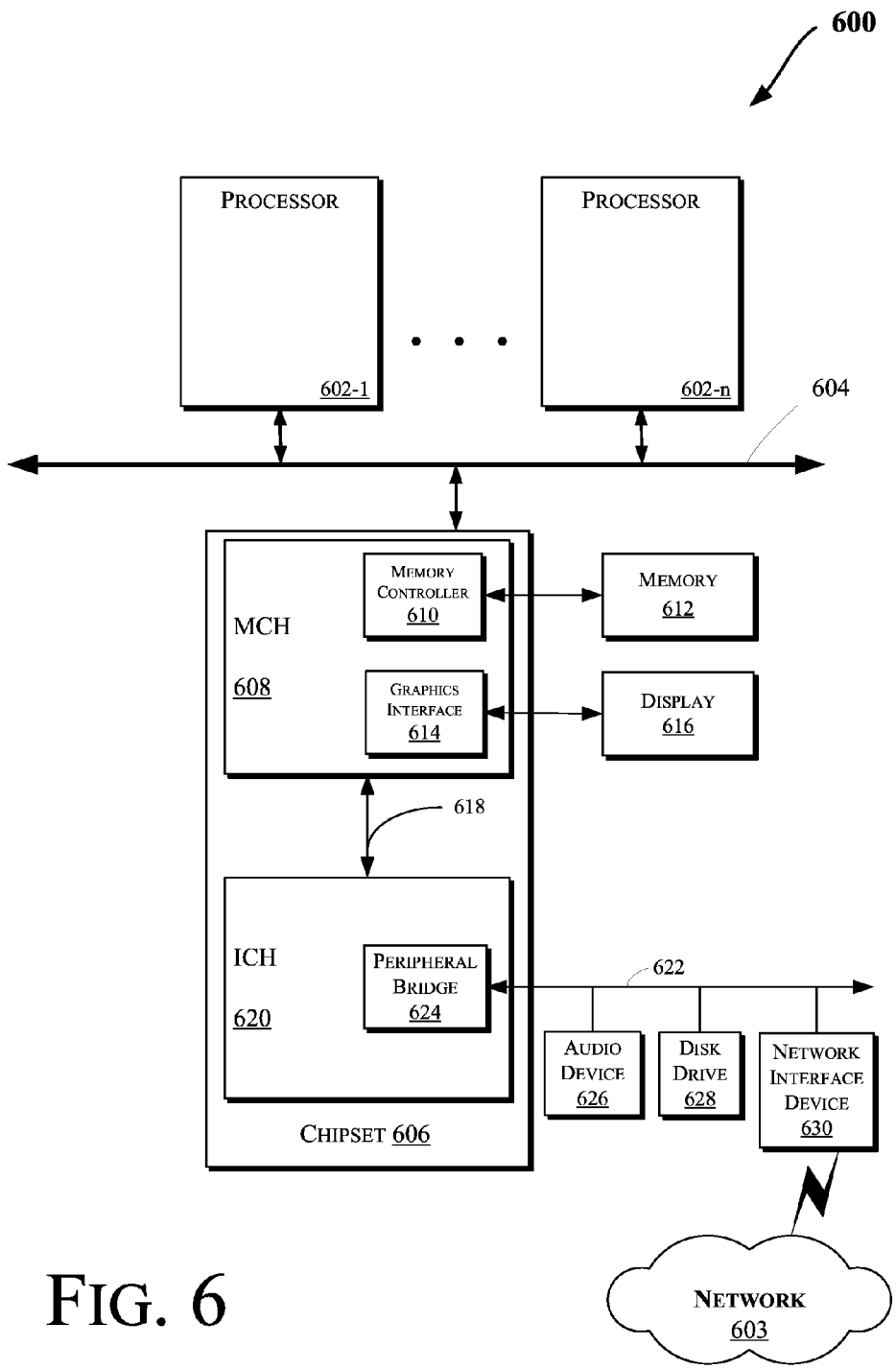
FIGS. 6-10 are schematic, block diagram illustrations of electronic devices which may be adapted to implement methods to reduce power delivery noise for partial writes in accordance with various embodiments discussed herein.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may include the control unit 120 discussed with reference to FIGS. 1-3.

Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
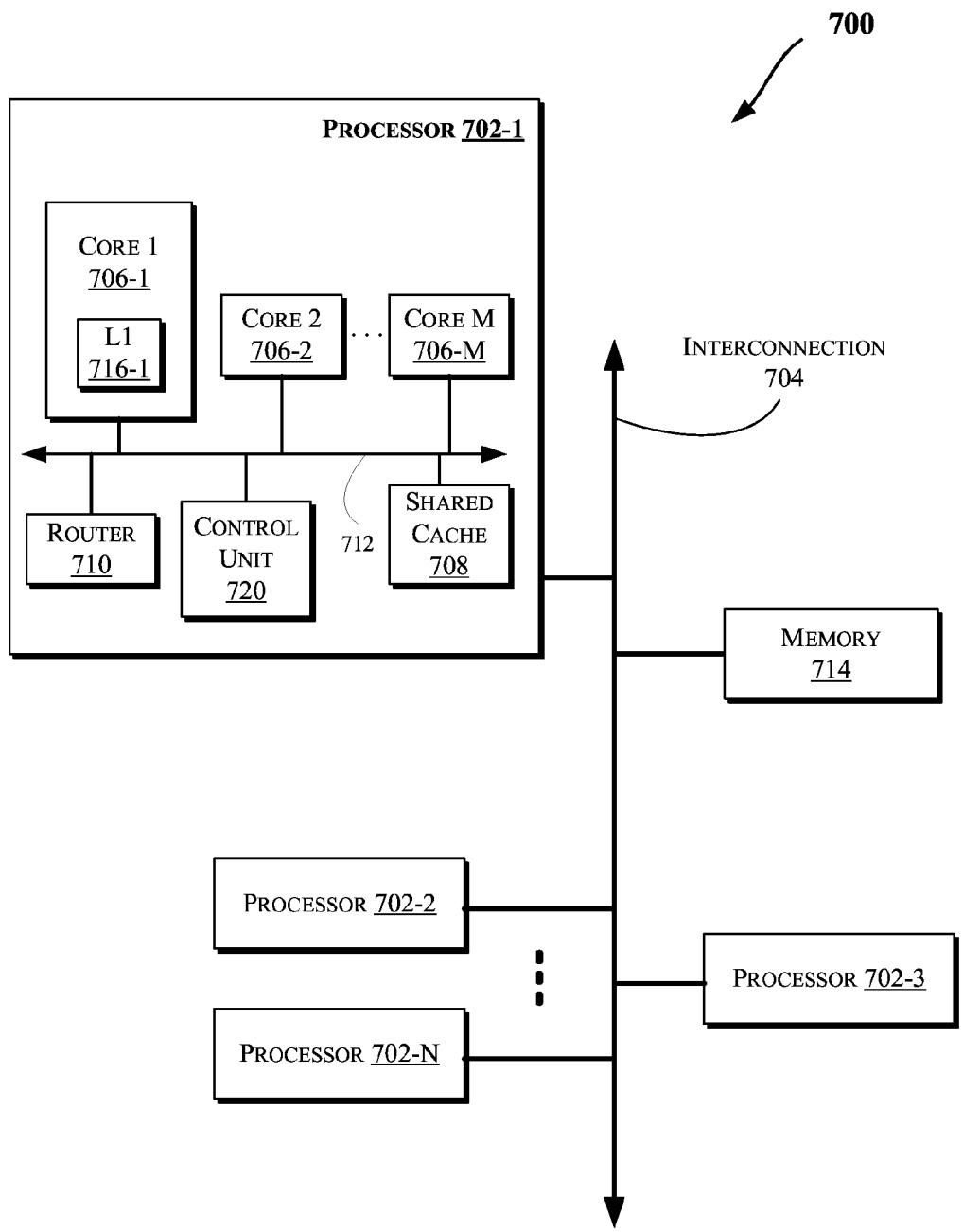

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the control unit 720 may include logic to implement the operations described above with reference to the memory controller 122 in FIG. 2.

Figure 8:
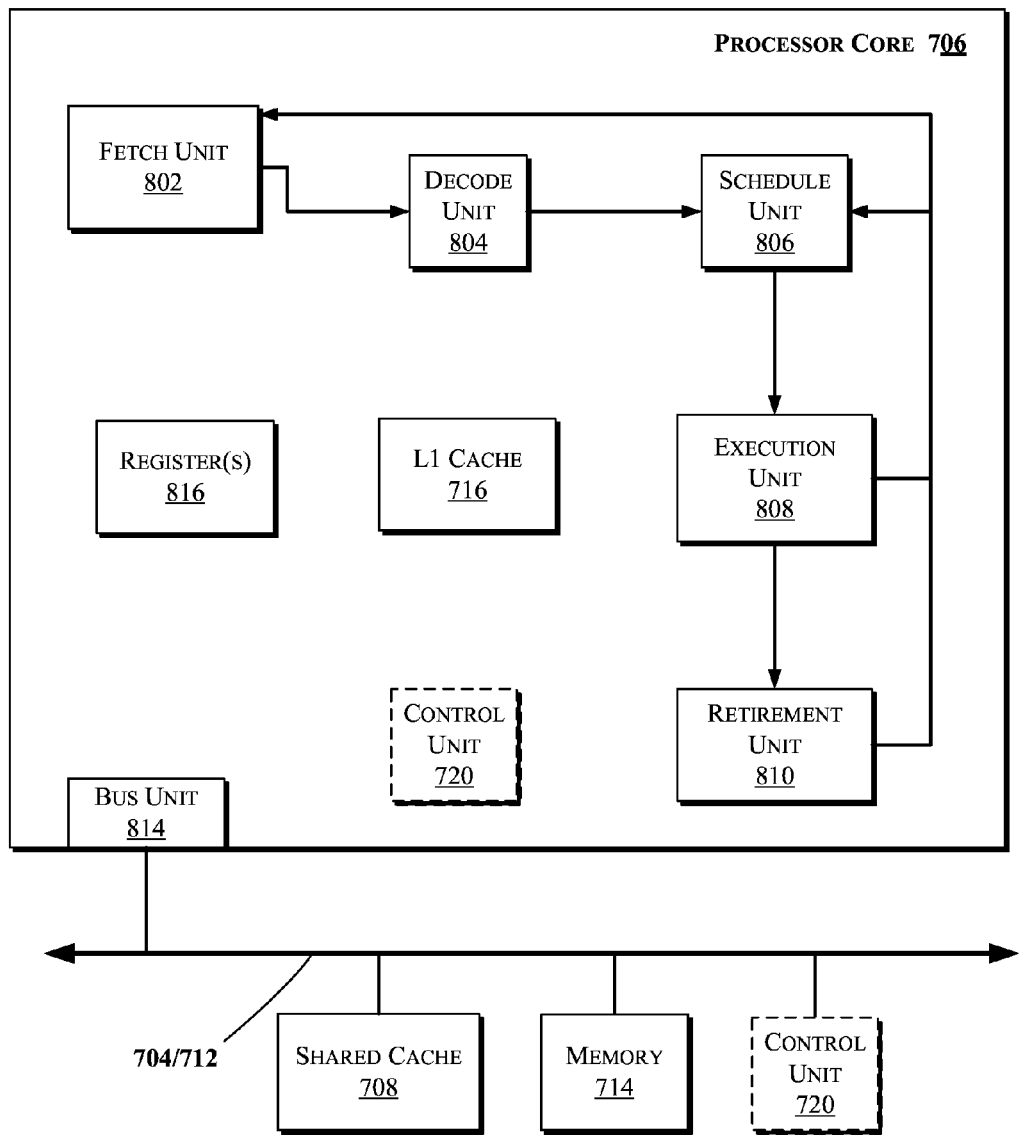

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
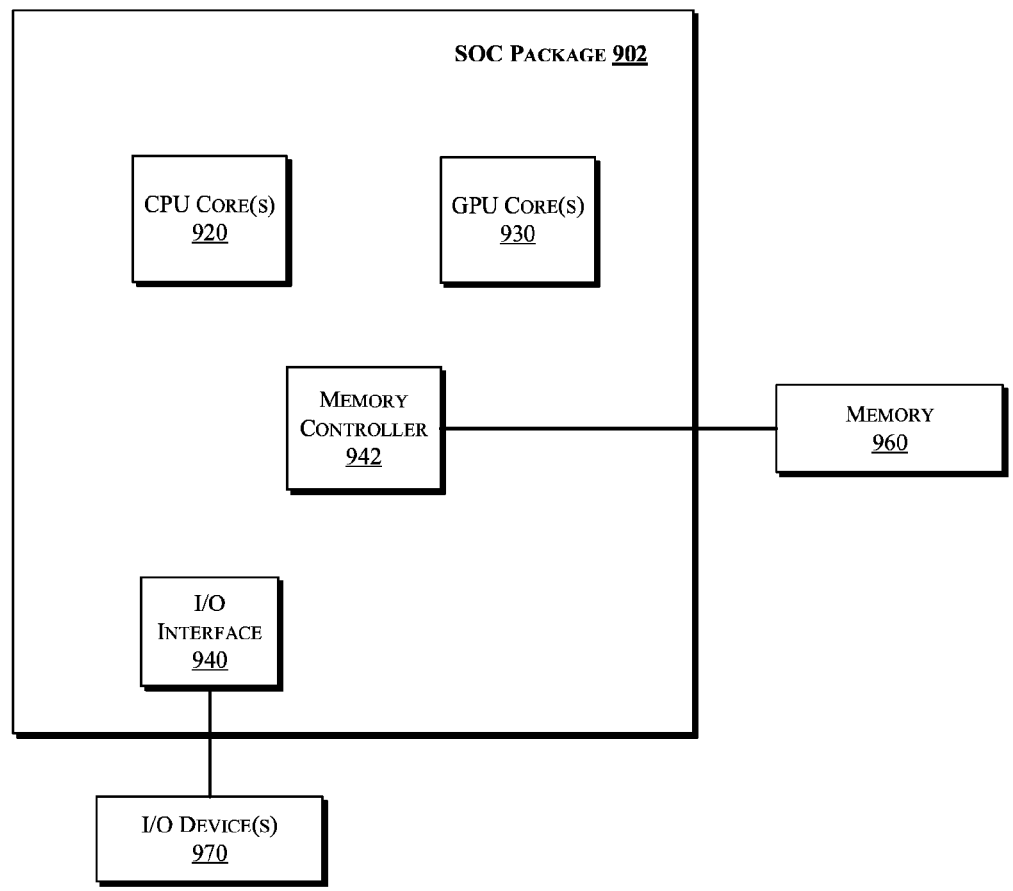

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
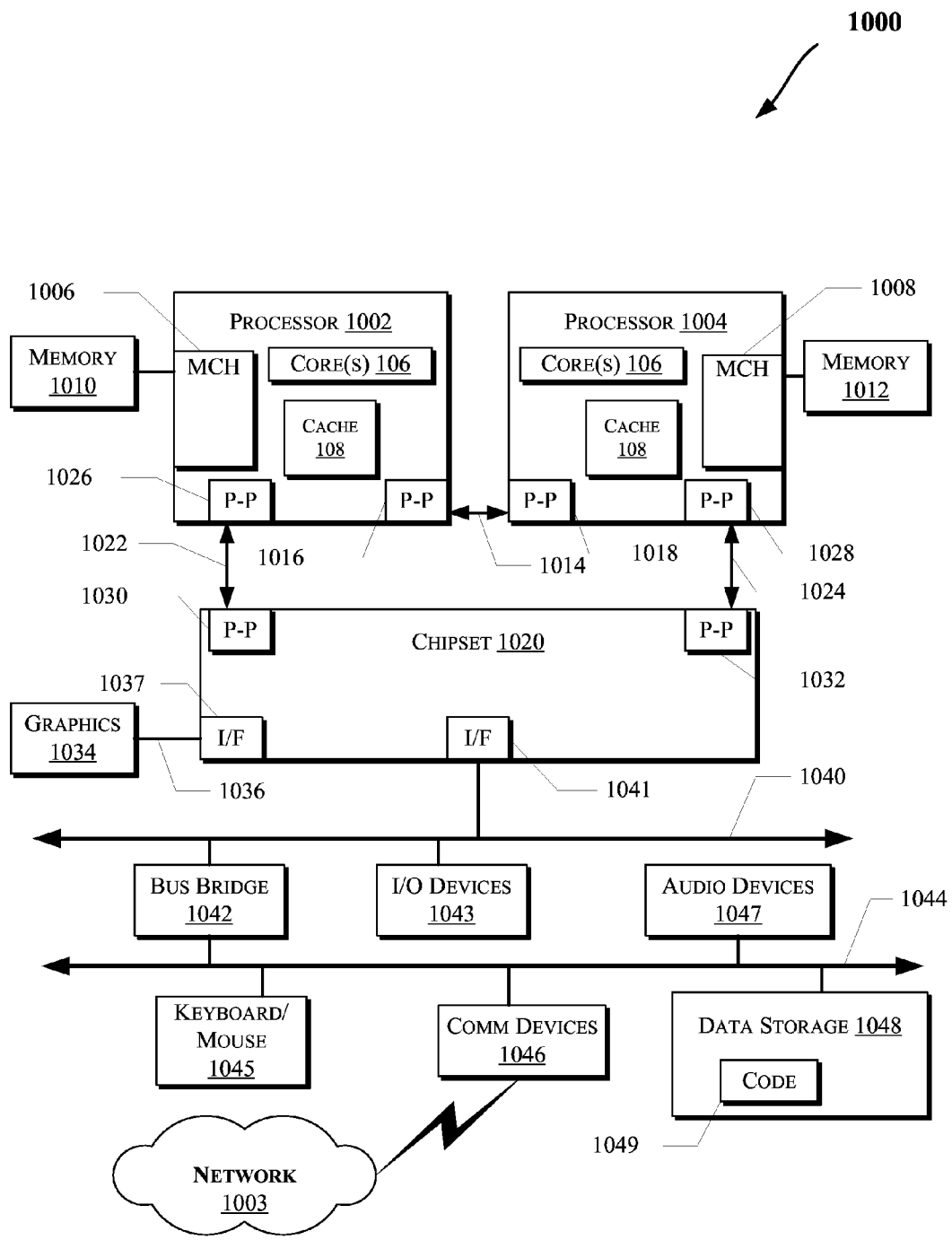

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 902 and 904. Other embodiments of the invention, however, may exist in other circuits, logic units, or devices within the system 900 of FIG. 9. Furthermore, other embodiments of the invention may be distributed throughout several circuits, logic units, or devices illustrated in FIG. 9.

The chipset 920 may communicate with a bus 940 using a PtP interface circuit 941. The bus 940 may have one or more devices that communicate with it, such as a bus bridge 942 and I/O devices 943. Via a bus 944, the bus bridge 943 may communicate with other devices such as a keyboard/mouse 945, communication devices 946 (such as modems, network interface devices, or other communication devices that may communicate with the computer network 803), audio I/O device, and/or a data storage device 948. The data storage device 948 (which may be a hard disk drive or a NAND flash based solid state drive) may store code 949 that may be executed by the processors 902 and/or 904.

The following examples pertain to further embodiments.

Example 1 is an apparatus comprising a processor and memory control logic to insert one or more dummy unit intervals into data in a write operation when a number of state transitions between adjacent unit intervals exceeds a threshold.

In Example 2, the subject matter of Example 1 can optionally include logic to monitor data in a first unit interval and a second unit interval adjacent the first user interval in the write operation and insert a dummy unit interval between the first unit interval and the second unit interval when a number of state transitions between the first unit interval and the second unit interval exceeds a threshold In Example 3, the subject matter of any one of Examples 1-2 can optionally include logic to pad the dummy unit interval with data, wherein the data reduces the number of state transitions between adjacent unit intervals.

In Example 4, the subject matter of any one of Examples 1-3 can optionally include an arrangement wherein the data is written to a memory device, the memory device is terminated to ground, and the dummy unit interval is padded with data to reduce a number of transitions from a logic 0 state to a logic 1 state.

In Example 5, the subject matter of any one of Examples 1-3 can optionally include an arrangement wherein the data is written to a memory device, the memory device is terminated to a logic high voltage, and the dummy unit interval is padded with data to reduce a number of transitions from a logic 1 state to a logic 0 state.

In Example 6, the subject matter of any one of Examples 1-3 can optionally include an arrangement wherein the data is written to a memory device, the memory device is not terminated, and the dummy unit interval is padded with data to reduce a number of transitions between logic states.

In Example 7, the subject matter of any one of Examples 1-6 can optionally include logic to place the dummy unit interval on a data bus coupled to a memory device and mask the dummy unit interval.

Example 8 is a memory controller comprising logic to insert one or more dummy unit intervals into data in a write operation when a number of state transitions between adjacent unit intervals exceeds a threshold.

In Example 9, the subject matter of Example 8 can optionally include logic to monitor data in a first unit interval and a second unit interval adjacent the first user interval in the write operation and insert a dummy unit interval between the first unit interval and the second unit interval when a number of state transitions between the first unit interval and the second unit interval exceeds a threshold.

In Example 10, the subject matter of any one of Examples 8-9 can optionally include logic to pad the dummy unit interval with data, wherein the data reduces the number of state transitions between adjacent unit intervals.

In Example 11, the subject matter of any one of Examples 8-10 can optionally include an arrangement wherein the data is written to a memory device, the memory device is terminated to ground, and the dummy unit interval is padded with data to reduce a number of transitions from a logic 0 state to a logic 1 state.

In Example 12, the subject matter of any one of Examples 8-10 can optionally include an arrangement wherein the data is written to a memory device, the memory device is terminated to a logic high voltage, and the dummy unit interval is padded with data to reduce a number of transitions from a logic 1 state to a logic 0 state.

In Example 13, the subject matter of any one of Examples 8-10 can optionally include an arrangement wherein the data is written to a memory device, the memory device is not terminated, and the dummy unit interval is padded with data to reduce a number of transitions between logic states.

In Example 14, the subject matter of any one of Examples 8-13 can optionally include logic to place the dummy unit interval on a data bus coupled to a memory device and mask the dummy unit interval.

Example 15 is a method to manage write operations, comprising inserting one or more dummy unit intervals into data in a write operation when a number of state transitions between adjacent unit intervals exceeds a threshold.

In Example 16, the subject matter of Example 15 can optionally monitoring data in a first unit interval and a second unit interval adjacent the first user interval in the write operation and inserting a dummy unit interval between the first unit interval and the second unit interval when a number of state transitions between the first unit interval and the second unit interval exceeds a threshold.

In Example 17, the subject matter of any one of Examples 15-16 can optionally include padding the dummy unit interval with data, wherein the data reduces the number of state transitions between adjacent unit intervals.

In Example 18, the subject matter of any one of Examples 15-16 can optionally include an arrangement wherein the data is written to a memory device, the memory device is terminated to ground, and the dummy unit interval is padded with data to reduce a number of transitions from a logic 0 state to a logic 1 state.

In Example 19, the subject matter of any one of Examples 15-16 can optionally include an arrangement wherein the data is written to a memory device, the memory device is terminated to a logic high voltage, and the dummy unit interval is padded with data to reduce a number of transitions from a logic 1 state to a logic 0 state.

In Example 20, the subject matter of any one of Examples 15-16 can optionally include an arrangement wherein the data is written to a memory device, the memory device is not terminated, and the dummy unit interval is padded with data to reduce a number of transitions between logic states.

In Example 21, the subject matter of any one of Examples 15-22 can optionally include placing the dummy unit interval on a data bus coupled to a memory device and masking the dummy unit interval.

Example 22 is a computer program product comprising logic instructions stored in a non-transitory computer readable medium which, when executed by a controller, configure the controller to perform operations, comprising inserting one or more dummy unit intervals into data in a write operation when a number of state transitions between adjacent unit intervals exceeds a threshold.

In Example 23, the subject matter of Example 22 can optionally include logic instructions stored in the non-transitory computer readable medium which, when executed by the controller, configure the controller to perform operations comprising monitoring data in a first unit interval and a second unit interval adjacent the first user interval in the write operation and inserting a dummy unit interval between the first unit interval and the second unit interval when a number of state transitions between the first unit interval and the second unit interval exceeds a threshold.

In Example 24, the subject matter of any one of Examples 22-23 can optionally include logic instructions stored in the non-transitory computer readable medium which, when executed by the controller, configure the controller to perform operations comprising padding the dummy unit interval with data, wherein the data reduces the number of state transitions between adjacent unit intervals.

In Example 25, the subject matter of any one of Examples 22-24 can optionally include an arrangement wherein the data is written to a memory device, the memory device is terminated to ground, and the dummy unit interval is padded with data to reduce a number of transitions from a logic 0 state to a logic 1 state.

In Example 26, the subject matter of any one of Examples 22-24 can optionally include an arrangement wherein the data is written to a memory device, the memory device is terminated to a logic high voltage, and the dummy unit interval is padded with data to reduce a number of transitions from a logic 1 state to a logic 0 state.

In Example 27, the subject matter of any one of Examples 22-24 can optionally include an arrangement wherein the data is written to a memory device, the memory device is not terminated, and the dummy unit interval is padded with data to reduce a number of transitions between logic states.

In Example 28, the subject matter of any one of Examples 22-24 can optionally include logic instructions stored in the non-transitory computer readable medium which, when executed by the controller, configure the controller to perform operations comprising placing the dummy unit interval on a data bus coupled to a memory device and masking the dummy unit interval.

Example 29 is a memory controller, comprising means for inserting one or more dummy unit intervals into data in a write operation when a number of state transitions between adjacent unit intervals exceeds a threshold.

In Example 30, the subject matter of Example 29 can optionally include means for monitoring data in a first unit interval and a second unit interval adjacent the first user interval in the write operation, and means for inserting a dummy unit interval between the first unit interval and the second unit interval when a number of state transitions between the first unit interval and the second unit interval exceeds a threshold.

In Example 30, the subject matter of any one of Examples 28-29 can optionally include means for monitoring data in a first unit interval and a second unit interval adjacent the first user interval in the write operation, and means for inserting a dummy unit interval between the first unit interval and the second unit interval when a number of state transitions between the first unit interval and the second unit interval exceeds a threshold.

In Example 31, the subject matter of any one of Examples 28-30 can optionally include means for padding the dummy unit interval with data, wherein the data reduces the number of state transitions between adjacent unit intervals.

In Example 32, the subject matter of any one of Examples 28-30 can optionally include an arrangement wherein the data is written to a memory device, the memory device is terminated to ground, and the dummy unit interval is padded with data to reduce a number of transitions from a logic 0 state to a logic 1 state.

In Example 33, the subject matter of any one of Examples 28-30 can optionally include an arrangement wherein the data is written to a memory device, the memory device is terminated to a logic high voltage, and the dummy unit interval is padded with data to reduce a number of transitions from a logic 1 state to a logic 0 state.

In Example 34, the subject matter of any one of Examples 28-30 can optionally include an arrangement wherein the data is written to a memory device, the memory device is not terminated, and the dummy unit interval is padded with data to reduce a number of transitions between logic states.

In Example 35, the subject matter of any one of Examples 28-34 can optionally include means for placing the dummy unit interval on a data bus coupled to a memory device and masking the dummy unit interval.

In various embodiments of the invention, the operations discussed herein, e.g., with reference to FIGS. 1-10, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
   a processor; and
   a memory control logic to:
   insert one or more dummy unit intervals into data in a write operation when a number of state transitions between adjacent unit intervals exceeds a threshold;
   associate one or more data mask bits with each of the one or more dummy unit intervals, wherein the one or more data mask bits serves as a signal to a controller that the data in the dummy unit intervals is not to be written to memory; and
   transmit the one or more data mask bits on a communication bus with the one or more dummy unit intervals.

2. The apparatus of claim 1, further comprising logic to:
   monitor data in a first unit interval and a second unit interval adjacent the first user interval in the write operation; and
   insert a dummy unit interval between the first unit interval and the second unit interval when a number of state transitions between the first unit interval and the second unit interval exceeds a threshold.

3. The apparatus of claim 1, further comprising logic to pad the dummy unit interval with data, wherein the data reduces the number of state transitions between adjacent unit intervals.

4. The apparatus of claim 3, wherein:
   the data is written to a memory device;
   the memory device is terminated to ground; and
   the dummy unit interval is padded with data to reduce a number of transitions from a logic 0 state to a logic 1 state.

5. The apparatus of claim 3, wherein:
   the data is written to a memory device;
   the memory device is terminated to a logic high voltage; and
   the dummy unit interval is padded with data to reduce a number of transitions from a logic 1 state to a logic 0 state.

6. The apparatus of claim 3, wherein:
the data is written to a memory device;
the memory device is not terminated; and
the dummy unit interval is padded with data to reduce a number of transitions between logic states.

7. The apparatus of claim 1, further comprising logic to:
place the dummy unit interval on a data bus coupled to a memory device; and
mask the dummy unit interval.

8. A memory controller comprising logic to:
insert one or more dummy unit intervals into data in a write operation when a number of state transitions between adjacent unit intervals exceeds a threshold
associate one or more data mask bits with each of the one or more dummy unit intervals, wherein the one or more data mask bits serves as a signal to a controller that the data in the dummy unit intervals is not to be written to memory; and
transmit the one or more data mask bits on a communication bus with the one or more dummy unit intervals.

9. The memory controller of claim 8, further comprising logic to:
monitor data in a first unit interval and a second unit interval adjacent the first user interval in the write operation; and
insert a dummy unit interval between the first unit interval and the second unit interval when a number of state transitions between the first unit interval and the second unit interval exceeds a threshold.

10. The memory controller of claim 8, further comprising logic to pad the dummy unit interval with data, wherein the data reduces the number of state transitions between adjacent unit intervals.

11. The memory controller of claim 10, wherein:
the data is written to a memory device;
the memory device is terminated to ground; and
the dummy unit interval is padded with data to reduce a number of transitions from a logic 0 state to a logic 1 state.

12. The memory controller of claim 10, wherein:
the data is written to a memory device;
the memory device is terminated to a logic high voltage; and
the dummy unit interval is padded with data to reduce a number of transitions from a logic 1 state to a logic 0 state.

13. The memory controller of claim 10, wherein:
the data is written to a memory device;
the memory device is not terminated; and
the dummy unit interval is padded with data to reduce a number of transitions between logic states.

14. The memory controller of claim 8, further comprising logic to:
place the dummy unit interval on a data bus coupled to a memory device; and
mask the dummy unit interval.

15. A method to manage write operations, comprising:
inserting one or more dummy unit intervals into data in a write operation when a number of state transitions between adjacent unit intervals exceeds a threshold
associating one or more data mask bits with each of the one or more dummy unit intervals, wherein the one or more data mask bits serves as a signal to a controller that the data in the dummy unit intervals is not to be written to memory; and
transmitting the one or more data mask bits on a communication bus with the one or more dummy unit intervals.

16. The method of claim 15, further comprising:
monitoring data in a first unit interval and a second unit interval adjacent the first user interval in the write operation; and
inserting a dummy unit interval between the first unit interval and the second unit interval when a number of state transitions between the first unit interval and the second unit interval exceeds a threshold.

17. The method of claim 15, further comprising padding the dummy unit interval with data, wherein the data reduces the number of state transitions between adjacent unit intervals.

18. The method of claim 17, wherein:
the data is written to a memory device;
the memory device is terminated to ground; and
the dummy unit interval is padded with data to reduce a number of transitions from a logic 0 state to a logic 1 state.

19. The method of claim 17, wherein:
the data is written to a memory device;
the memory device is terminated to a logic high voltage; and
the dummy unit interval is padded with data to reduce a number of transitions from a logic 1 state to a logic 0 state.

20. The method of claim 17, wherein:
the data is written to a memory device;
the memory device is not terminated; and
the dummy unit interval is padded with data to reduce a number of transitions between logic states.

21. The method of claim 15, further comprising:
placing the dummy unit interval on a data bus coupled to a memory device; and
masking the dummy unit interval.

22. A computer program product comprising logic instructions stored in a non-transitory computer readable medium which, when executed by a controller, configure the controller to perform operations, comprising:
inserting one or more dummy unit intervals into data in a write operation when a number of state transitions between adjacent unit intervals exceeds a threshold
associating one or more data mask bits with each of the one or more dummy unit intervals, wherein the one or more data mask bits serves as a signal to a controller that the data in the dummy unit intervals is not to be written to memory; and
transmitting the one or more data mask bits on a communication bus with the one or more dummy unit intervals.

23. The computer program product of claim 22, further comprising logic instructions stored in the non-transitory computer readable medium which, when executed by the controller, configure the controller to perform operations comprising:
monitoring data in a first unit interval and a second unit interval adjacent the first user interval in the write operation; and
inserting a dummy unit interval between the first unit interval and the second unit interval when a number of state transitions between the first unit interval and the second unit interval exceeds a threshold.

24. The computer program product of claim 22, further comprising logic instructions stored in the non-transitory computer readable medium which, when executed by the controller, configure the controller to perform operations comprising padding the dummy unit interval with data, wherein the data reduces the number of state transitions between adjacent unit intervals.

25. The computer program product of claim 24, wherein:
the data is written to a memory device;
the memory device is terminated to ground; and
the dummy unit interval is padded with data to reduce a number of transitions from a logic 0 state to a logic 1 state.

* * * * *